United States Patent
Müller et al.

(10) Patent No.: US 7,989,776 B2
(45) Date of Patent: Aug. 2, 2011

(54) CORRECTIVE FOR ELIMINATING THE THIRD-ORDER APERTURE ABERRATION AND THE FIRST-ORDER, FIRST-DEGREE AXIAL, CHROMATIC ABERRATION

(75) Inventors: Heiko Müller, Heidelberg (DE); Harald Rose, Darmstadt (DE)

(73) Assignee: CEOS Corrected Electron Optical Systems GmbH, Heidelberg (DE)

( * ) Notice: Subject to any disclaimer, the term of this patent is extended or adjusted under 35 U.S.C. 154(b) by 350 days.

(21) Appl. No.: 12/096,579

(22) PCT Filed: Dec. 6, 2005

(86) PCT No.: PCT/DE2005/002210
§ 371 (c)(1),
(2), (4) Date: Aug. 4, 2008

(87) PCT Pub. No.: WO2007/065382
PCT Pub. Date: Jun. 14, 2007

(65) Prior Publication Data
US 2008/0283749 A1    Nov. 20, 2008

(51) Int. Cl.
*H01J 1/50*    (2006.01)
(52) U.S. Cl. .............. 250/396 ML; 250/396 R; 250/397
(58) Field of Classification Search .............. 250/396 R, 250/397, 398, 399, 400, 396 ML
See application file for complete search history.

(56) References Cited

U.S. PATENT DOCUMENTS

| | | |
|---|---|---|
| 2003/0034457 A1 | 2/2003 | Rose |
| 2004/0155200 A1 | 8/2004 | Muller |
| 2005/0023480 A1 | 2/2005 | Rose |

FOREIGN PATENT DOCUMENTS
EP    1381073 A1    1/2004

*Primary Examiner* — Phillip A Johnston
*Assistant Examiner* — Hanway Chang
(74) *Attorney, Agent, or Firm* — Paul Vincent

(57) ABSTRACT

A corrective for eliminating the third-order aperture aberration and the first-order, first-degree axial chromatic aberration includes two correction pieces, which are arranged one behind the other in the direction of the optical axis, in which each correction piece has a plurality of quadrupole fields (QP) and at least one octupole field (OP.) Each correction piece is constructed such that it is symmetrical with respect to its central plane (S, S') with each correction piece having an uneven number of at least five quadrupole fields (QP) and at least one octupole field (OP). Each correction piece is further constructed so that it is symmetrical with respect to its central plane. The central quadrupole field is arranged so that it is centered with respect to the central plane of the correction piece and is electromagnetic. The quadrupole fields of the two correction pieces are antisymmetrical and a transfer lens system is arranged such that it is symmetrical with respect to the central plane of the corrective between the correction pieces. The transfer lens system has two round lenses and the setting of the transfer lens system takes place so that the two round lenses image the central plane of the two correction pieces anamorphically onto one another, in which the enlargement in one main section is the reciprocal of the enlargement in the other main section and with an octupole field superimposed on the central quadrupole field.

14 Claims, 3 Drawing Sheets

CORRECTIVE FOR ELIMINATING THE THIRD-ORDER APERTURE ABERRATION AND THE FIRST-ORDER, FIRST-DEGREE AXIAL, CHROMATIC ABERRATION

BACKGROUND OF THE INVENTION

1. Technical Field of the Invention

The invention relates to a corrective for eliminating the third order aperture aberration and the first order, first-degree axial chromatic aberration, comprising two correction pieces, which are arranged one behind the other, each correction piece having a plurality of quadrupole fields and at least one octupole field, and each correction piece being symmetrically constructed with respect to its central plane.

2. Description of the Prior Art

Electron-optical imaging systems are used both for enlarging, such as in electron microscopy, and for diminishing, such as in electron-projection lithography. Compared with light-optical imaging systems, they have the advantage of a substantially higher resolution, which is the result of the much smaller wavelength of the imaging optical rays. Compared to light, electron-optical imaging systems offer a resolution improvement of a factor of about $10^4$ depending on the acceleration voltage.

The guidance of electron beams for the purposes of imaging is performed by means of electrical and/or magnetic lenses. Such lens systems, depending on their construction and arrangement, are subject to extremely diverse imaging aberrations, which can be classified as follows:

Axial aberrations: These are the image aberrations that occur with the imaging of an axial point and are only dependent on the aperture angle of the ray emerging from the axial point. Extra-axial aberrations: They occur with the imaging of an extra-axial image point and are determined by the distance of the image point from the optical axis (and possibly additionally by the aperture angle.) Each image aberration which is determined solely by its distance from the optical axis is termed distortion.

Chromatic image aberrations: since the imaging particles are not monochromatic, that is to say have different velocities, chromatic aberrations occur, which in turn can be subdivided into axial and extra-axial aberrations and are correspondingly co-determined by the aperture angle and/or by the distance from the optical axis. The axial and extra-axial image aberration are summarized as geometrical image aberrations in order to distinguish them from chromatic image aberrations. Finally, the axial image aberrations, since they only depend on the aperture angle, are also known as aperture aberrations. The efficiency of high-resolution electron-optical systems, such as those used in electron microscopy, is limited by spherical aberration (i.e., third order aperture aberration) and the first order, first degree axial chromatic aberration of the objective lens. Considerable efforts have therefore been made to eliminate these aberrations with the aid of appropriate correctives. One of the most promising methods is to use correctives that are constructed from multipoles, in particular those that generate quadrupole and octupole fields.

A corrective of this generic type can be found in German Patent DE-A 101 59 308 from the same applicant, which discloses a double-symmetrical arrangement of quadrupole and octupole fields. A disadvantage of this arrangement can be seen in the fact that no octupole fields are provided for correction of the third-order extra-axial coma, and that the octupoles, by virtue of their arrangement, generate large coma-like fifth order image aberrations for correction of the aperture aberrations. The illustrated principle of aperature and chromatic aberration correction in astigmatic intermediate images has proved incompatible with the essential demand for a large number of image points, which is essential for maximum resolution transmission electron microscopy.

SUMMARY OF THE INVENTION

Based on the device of this generic type, it is the object of the invention to provide a corrective that permits correction the third order spherical aberration, as well as the first order, first degree chromatic aberration.

This object is achieved according to the invention in that each correction piece consists of an uneven number of at least five quadrupole fields and at least one octupole field, each correction piece being symmetrically constructed with respect to its central plane, the central quadrupole field being arranged such that it is centered with respect to the central plane of the correction piece and is electromagnetic, the quadrupole fields of the two correction pieces being anti symmetrical, and a transfer lens system being arranged such that it is symmetrical with respect to the central plane of the corrective, which comprises at least one circular lens and the setting of the transfer lens system takes place such that the central planes of the two correction pieces are imaged anamorphically on one another, the enlargement in one principal section being the reciprocal of the enlargement in the other principal section, and the central quadrupole field being superimposed by an octupole field.

The ratio of the electrical and magnetic quadrupole field intensity can be varied independently of the resulting refractive power of the combined element and set such that the chromatic aberration of the entire system, consisting of corrective and objective lens, disappears. On the electromagnetic quadrupole field of the correction piece, an octupole field is superimposed to correct the aperture aberration.

The quadrupole fields in the second correction piece are oriented antisymmetrically to those in the first correction piece. The octupole fields for aperture aberration correction are, by contrast, oriented symmetrically with respect to the central plane of the corrective. The transfer lens system between the two correction pieces consists of at least one circular lens. The transfer lens system is set such that the central planes of the two correction pieces are optically conjugated planes. The resulting imaging between these two planes is stigmatic and anamorphic, that is to say, the enlargement with respect to the two principal sections is different, moreover, the enlargement in one section (first principal section) is the reciprocal of the enlargement of the other section (second principal section.) The enlargement in the first and second principal section, between the two central planes of the correction pieces, differ from one another such that, in the region of the combined electromagnetic quadrupole fields, the axial ray emerging from one image point has a strongly elliptical cross-section. In the first correction piece, the longer half-axis of the cross-sectional ellipse is oriented in the x-direction and the correction preferably takes place in the xz-section. In the second correction piece, the longer half-axis of the cross-sectional ellipse is oriented in the y-direction and the correction preferably takes place in the y-section. The two correction pieces together effect the complete correction of the axial first order, first degree chromatic aberration and the third order aperture aberration of the objective lens in both principal sections. The principle of correction in mutually conjugated anamorphic planes, according to the invention, replaces the principle of correction in astigmatic intermediate images.

DETAILED DESCRIPTION OF THE PREFERRED EMBODIMENTS

The corrective, by virtue of its symmetry, does not introduce third order stellar aberrations with twofold symmetry $S_3$. Therefore, it remains to correct the third order astigmatism $A_3$ with four-fold symmetry introduced by the corrective. This is performed by means of a single octupole field, which is positioned in a plane that is optically conjugated to the central planes of the corrector pieces.

The construction in the direction of the optical axis is as follows: First, there are two quadrupole fields at a distance apart, one behind the other. To the following third quadrupole field there are assigned one or more octupole fields. This is followed, symmetrically to the central plane of the central quadrupole field, by two further quadrupole fields in symmetrical arrangement. Between the two correction pieces, in the plane of symmetry, the transfer lens system is introduced, which in turn is also symmetrical to the central plane. In the most general construction, it consists of at least one circular lens. The transfer lens system is set such that the central quadrupole fields and the octupole fields of the two correction pieces are imaged on one another. The above-described corrective permits the elimination of the third order aperature aberration C3 and the first order, first degree chromatic aberration $C_c$.

A transfer lens system construction from two circular lenses of identical focal length f is preferred. The distance of the last quadrupole of the first correction piece from the first circular lens of the transfer lens system is f, as is the distance of the second circular lens from the first quadrupole of the second correction piece. The distance between the two circular lenses is 2f. The polarities of the lenses are opposite, such that their contributions to the Larmor rotation approximately compensate one another.

In an advantageous embodiment, the setting of the corrective, more precisely the setting of the quadrupole fields and of the transfer lens system, takes place such that the axial fundamental paths, as the $(x_\alpha, y_\beta)$ paths emerging from the image center point, intersect the optical axis in the first and last quadrupole of each correction piece and the extra-axial paths $(x_\gamma, y_\delta)$, which in each case lie in the xz or yz section respectively, intersect the optical axis in the center of the central quadrupole fields of each correction piece, and thereby generate a stigmatic diffraction pattern of the incoming image plane. Correspondingly, the fundamental paths have the following course: in the xz-section, the fundamental path $x_\alpha$ passes through the center of the first quadrupole and is therefore not deflected. Correspondingly, an intermediate image is produced there. In the second and third quadrupole field, the deflection takes place in the opposite directions, the further course of the fundamental path also being symmetrical by virtue of the symmetry of the correction piece. The transfer lens system has the effect that the fundamental path enters the second correction piece in the same manner as the first correction piece. Because of the antisymmetry of the quadrupole fields, the further course in the second correction piece corresponds to the course of the $y_\beta$ in the first correction piece.

In the xz-section, the extra-axial fundamental path $x_\gamma$ runs such that the fundamental path enters the first quadrupole axially parallel and thereby—in contrast to the fundamental path $x_\alpha$, which passes through the central point of the quadrupole and therefore remains undeflected—undergoes a deflection towards the optical axis. The fundamental path $x_\gamma$ passes through the second quadrupole in the region close to the axis, so that only a small deflection takes place, and then intersects the optical axis in the center of the third quadrupole.

The further course of the fundamental path $x_\gamma$ is antisymmetrical to the central plane of the correction piece. In the subsequent transfer lens system, the fundamental path $x_\gamma$ also runs antisymmetrically, and thus intersects the optical axis in the center of the transfer lens system. For this reason, the fundamental path $x_\gamma$ also enters the second correction piece in the same way as the first correction piece. Because of the antisymmetry of the quadrupole fields, the further course of the $x_\gamma$ path in the second correction piece corresponds to the course of the $y_\beta$ fundamental path in the first correction piece.

In the yz-section, the following applies: The fundamental path $y_\beta$ emerging from the image center point passes through the optical axis in the first quadrupole and thereby remains unaffected. In the second quadrupole, there is thus a deflection towards the optical axis. In the third quadrupole, there is a deflection of $y_\beta$ away from the optical axis, to subsequently, in the second half, execute a course that is symmetrical with respect to the central plane of the first correction piece, by virtue of the symmetry of the fields. In the transfer lens system, the fundamental path $y_\beta$ is deflected towards the optical axis, such that $y_\beta$ enters the second correction piece in the same direction as it enters the first correction piece. Because of the antisymmetry of the quadrupole fields, the further course of the $y_\beta$ path in the second correction piece corresponds to the course of the $x_\alpha$ fundamental path in the first correction piece.

The extra-axial fundamental path $y_\delta$ enters the first quadrupole in parallel at a distance from the optical axis—undergoes a deflection away from the optical axis and, in the second quadrupole, is deflected towards the optical axis. The optical axis is penetrated in the center of the third quadrupole field, and because of the symmetrical fields, the fundamental path emerges rotated through 180° from the first correction pieces, and, in the first correction piece, thereby has an antisymmetrical course with respect to the center of the third quadrupole. In the further course, $y_\delta$ passes antisymmetrically through the transfer lens system. Entry into the second correction piece takes place as into the first correction piece. Because of the antisymmetry of the quadrupole fields, the further course of the $y_\delta$ path in the second correction piece corresponds to the course of the $x_\gamma$ in the first correction piece. The above-described arrangement of a corrective, in the most general case, is subject to a four-fold third-order astigmatism $A_3$. Two alternative solutions are described for eliminating it. In the first, it is provided to apply an octupole field in the center of the transfer system, which is to be set so as to compensate the four-fold astigmatism. As an alternative, an octupole field can be arranged for correction of the same image aberration outside the corrective as well. In the latter case, an additional single transfer lens, TL3, is necessary, which ensures that the center of the external octupole field is conjugated with respect to the central plane of the correction pieces. The external octupole field and the additional transfer lens, seen in the ray direction, can be arranged in front of, or behind, the corrective. If the octupole field is in the center of the transfer lens system, this condition is fulfilled even without the use of an additional transfer lens TL3.

As regards the constructional design and realization of quadrupole fields and octupole fields, multipoles, which are known per se, can be used, which, depending on their "foldedness," permit the generation both of a quadrupole field and of an octupole field. The multipole construction unit thus allows the generation of mutually super-imposed multi-fold fields. Preferably, the use of a dodecapole field, permits the simultaneous generation of mutually superimposed quadrupole and octupole fields by electrical and/or magnetic methods.

To reduce the fifth order axial aberrations, the above-described invention can be developed beyond the systems described hitherto by superimposing dodecapole fields in the region of the correction piece in a symmetrical arrangement with respect to the center of the correction pieces. A dodecapole field can also be superimposed on the central or external octupole field. Particularly preferred is the generation of dodecapole fields on the central multipole element of each correction piece in an orientation that is antisymmetrical with respect to the central plane of the corrective and on the multipole elements immediately before and after the central quadrupole fields of the correction pieces. These dodecapole fields are oriented symmetrically with respect to the center of the correction element and antisymmetrically with respect to the center of the corrective. This last-described, especially preferred further embodiment permits the setting of the fifth order spherical aberration over a wide range around 0, which includes the optimum imaging conditions for the amplitude contrast imaging and the phase contrast imaging in the transmission electron microscope.

Besides the point resolution achievable for the axial image point, the magnitude of the image field that can be transmitted with uniform optical quality is of decisive importance for high-resolution electron microscopy. The magnitude of the usable image field, quantified by the number of image points that can be transmitted with uniform optical quality, is determined by the extra-axial aberrations that depend linearly on the distance of the image point from the optical axis. Image aberrations that depend on higher powers of the axial distance do not play a role in the maximum resolution because of their smallness.

The third order image aberration, which depends linearly on the distance from the axis, of a conventional objective lens is known as the extra-axial coma. This image aberration remains uncorrected in the case of correctives of conventional design. This deficiency has the consequence that, with conventional objective lenses and correctives for correction of the chromatic and aperture aberration in the case of a nominal point resolution of 0.05 nm with an acceleration voltage of 200 kV, only one image field of less than 400×400 image points can be transmitted, which is insufficient for use in extremely high resolution electron microscopy. Here, the transmission of at least 2,000×2,000 image points is required to allow the exploitations of the capacities of the planar electron detectors (CCD camera) used.

To increase the number of image points that can be transmitted with comparable optical quality, it has proved necessary to provide additional octupole fields to correct the third order extra-axial coma of the objective lens and, by a suitable arrangement of the octupole fields, for correction of the aperture aberration, to selectively minimize the induced fifth order coma-like aberrations, since the latter otherwise cause an unacceptable restriction of the number of image points.

For this purpose, at the beginning and end of the central quadrupole field of each correction piece of each correction piece, an octupole field in each case is arranged directly adjacently. In the transfer lens system, two octupole fields are also arranged equidistantly before and after the central plane of the corrective. In cases where the correction of the four-fold astigmatism must be performed in the transfer lens system, there are then three octupole fields in the transfer lens system. Moreover, in each correction piece, two octupole fields are arranged respectively immediately before and after the central quadrupole fields. These additional octupole fields are set, together with the two above-described octupole fields in the region of the transfer system, are set so as to correct the third order extra-axial coma.

Together with the objective lens, the corrective then forms an aplanatic and achromatic imaging system, that is to say, aperture aberrations, axial chromatic aberrations and extra-axial coma are simultaneously corrected. For the purpose of correcting the above-described image aberrations, the corrective is suitable, without restricting its generality, in a particular manner for use in high-resolution transmission-electron microscopes (TEM). Besides the elimination of the third order aperture aberration, which is important for the high resolution, as well as of the chromatic image aberration, the elimination of the extra-axial coma ensures the transmission of a large image field.

Between the corrective and objective lens, a transfer lens system is required, which is constructed from at least one circular lens. Together with the objective lens, this transfer system enlarges the object plane in the incoming image plane of the corrective. The setting of the transfer system is chosen, such that the central planes of the correction pieces are optically conjugated with the corrective-side focal plane of the objective lens, that is to say, with parallel illumination of the object diffraction images of the object plane come to lie in the center of the correction pieces.

By virtue of this special arrangement, all fifth order extra-axial image aberrations, which are linear in distance from the optical axis, are small, since the octupole fields in the central quadrupole and both the optional octupole field in the center of the transfer lens system and the alternative octupole field at the end of the corrective, which serve for correction of the third order axial image aberrations, in each case lie in diffraction images and do not contribute to a restriction of the image field.

BRIEF DESCRIPTION OF THE DRAWING FIGURES

Further details, features and advantages of the invention can be taken from the following part of the description. Herein, the construction and paraxial ray path of the corrective according to the invention are explained in greater detail with reference to a drawing that is diagrammatic in nature, wherein FIG. 1 shows the arrangement of the focusing elements of the corrective in the xz and yz sections.

DETAILED DESCRIPTION OF THE DRAWING FIGURES

Below, the quadrupole fields are designated QP, the octupole fields, OP, and the transfer lenses, TL. As regards the quadrupole field, the corrective is antisymmetrical with respect to the central plane, M, and, with the first (second) correction piece symmetrical to the central plane, S (S').

The object plane of the imaging system is imaged by the objective lens and, if appropriate, by a transfer lens system in the first quadrupole field, QP1, of the first correction piece. Correspondingly, the axial fundamental paths, $x_\alpha$, $y_\beta$, pass approximately through the center of the quadrupole field, QP1, and do not undergo deflection. The extra-axial fundamental paths $x_\gamma$, $y_\delta$, since the two fundamental paths extend in different principal sections, are deflected in different directions. The next quadrupole field, QP 2, which follows along the optical axis in the direction of the ray path, deflects the extra-axial fundamental paths, $x_\gamma$ and $y_\delta$, such that they pass through the optical axis centrally in the third quadrupole field, QP3. The axial fundamental paths, $x_\alpha$ and $y_\beta$, are diffracted by QP 3 towards the optical axis, or away from the optical axis, respectively.

This third quadrupole field, QP 3, is combinatorially electromagnetically constructed so that, while retaining its overall intensity and by setting the component of the electrical and magnetic quadrupole field intensity, influencing and elimination of the first order, first degree axial chromatic aberration becomes possible. Since each correction piece is constructed symmetrically with respect to its central plane, S, the quadrupole fields, QP 2' and QP1', following one another in the symmetry.

Following the first correction piece is the transfer lens system, TL2, which consists of two identical circular lenses, TL21 and TL22, of focal length f, which are arranged at a distance 2f from one another. They form a 4f system, in which the incoming image plane represents the central plane of the last quadrupole field, QPV, of the first correction piece and the outgoing image plane represents the central plane of the first quadrupole field, QP1'', of the second correction piece. Because of the required antisymmetry of the quadrupole fields, the second correction piece is antisymmetrically constructed with respect to the orientation of the quadrupole fields. The spatial arrangement, while neglecting the polarity, is the same for the individual multipole elements. In the xz-section, a ray path is thus obtained in the second correction piece, which corresponds to that in the yz-section in the first correction piece (and vice versa.)

Figure 1:
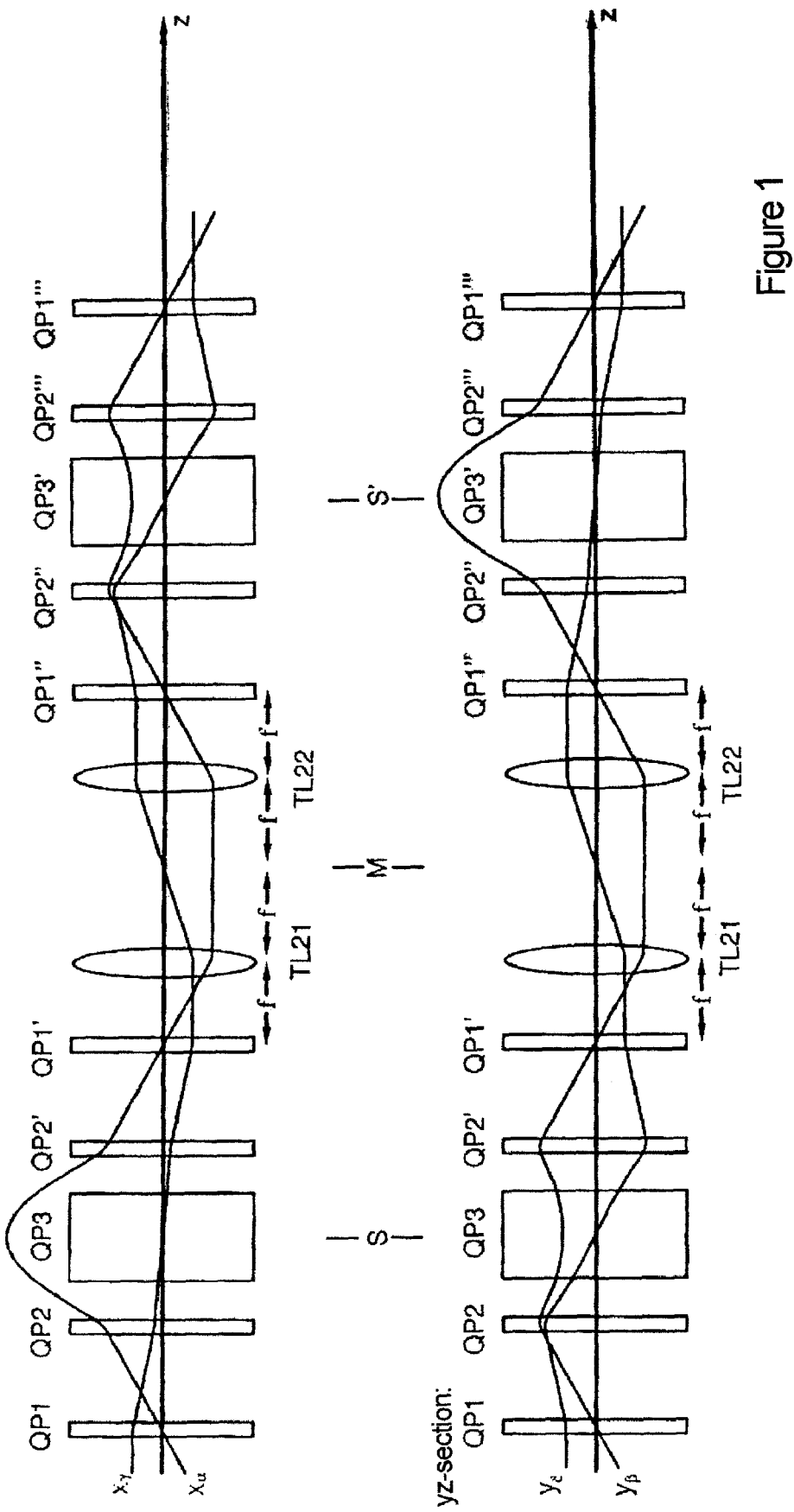
Figure 2:
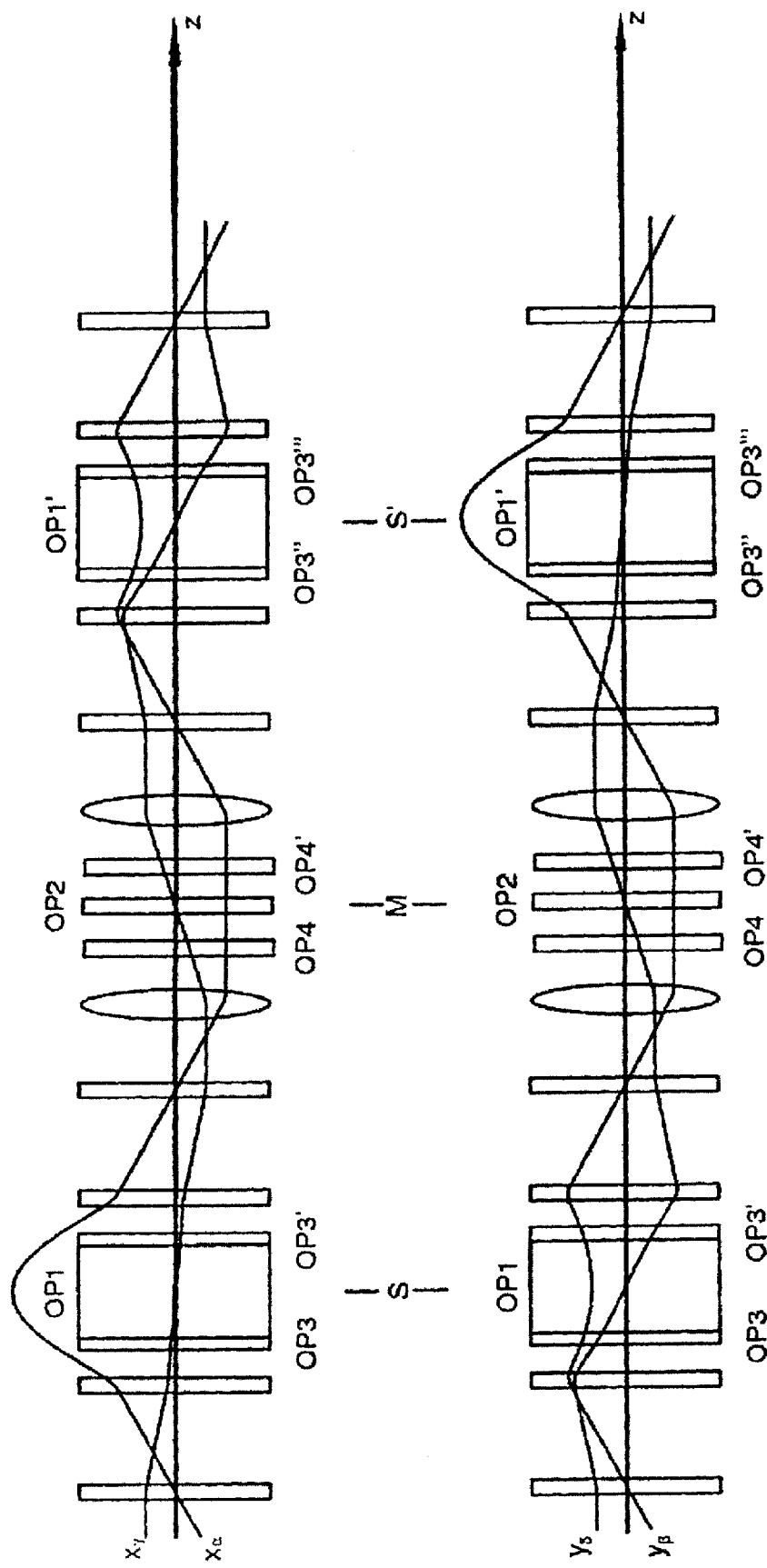
FIG. 2 shows the arrangement of octupole fields in the system according to FIG. 1.

FIG. 2 shows the arrangement of octupole fields in the correctives described in FIG. 1. The construction consequently agrees with that in FIG. 1, so that reference is made to this in order to avoid repetition.

The quadrupole fields, QP3, QP3'', in each case have an octupole field, OP1, OP1', superimposed on them and in the central plane of the corrective, M, there is a further octupole field OP2. The above-described octupole fields are oriented symmetrically with respect to the plane, M, and serve for complete correction of the third order axial aberrations. Immediately before and after the central quadrupole fields, QP3 and QP3', are arranged octupole fields, OP3, OP3', and OP3'', OP3'''. Likewise, there is a pair of octupole fields, OP4, OP4', in the region between the transfer lenses, TL21/TL22. The octupole fields, which are not located in the region of zero positions of the extra-axial fundamental paths, serve for complete correction of the third order extra-axial coma. The octupole field, OP2, arranged in the central plane of corrective serves for correction of the 3rd order four-fold astigmatism.

Figure 3:
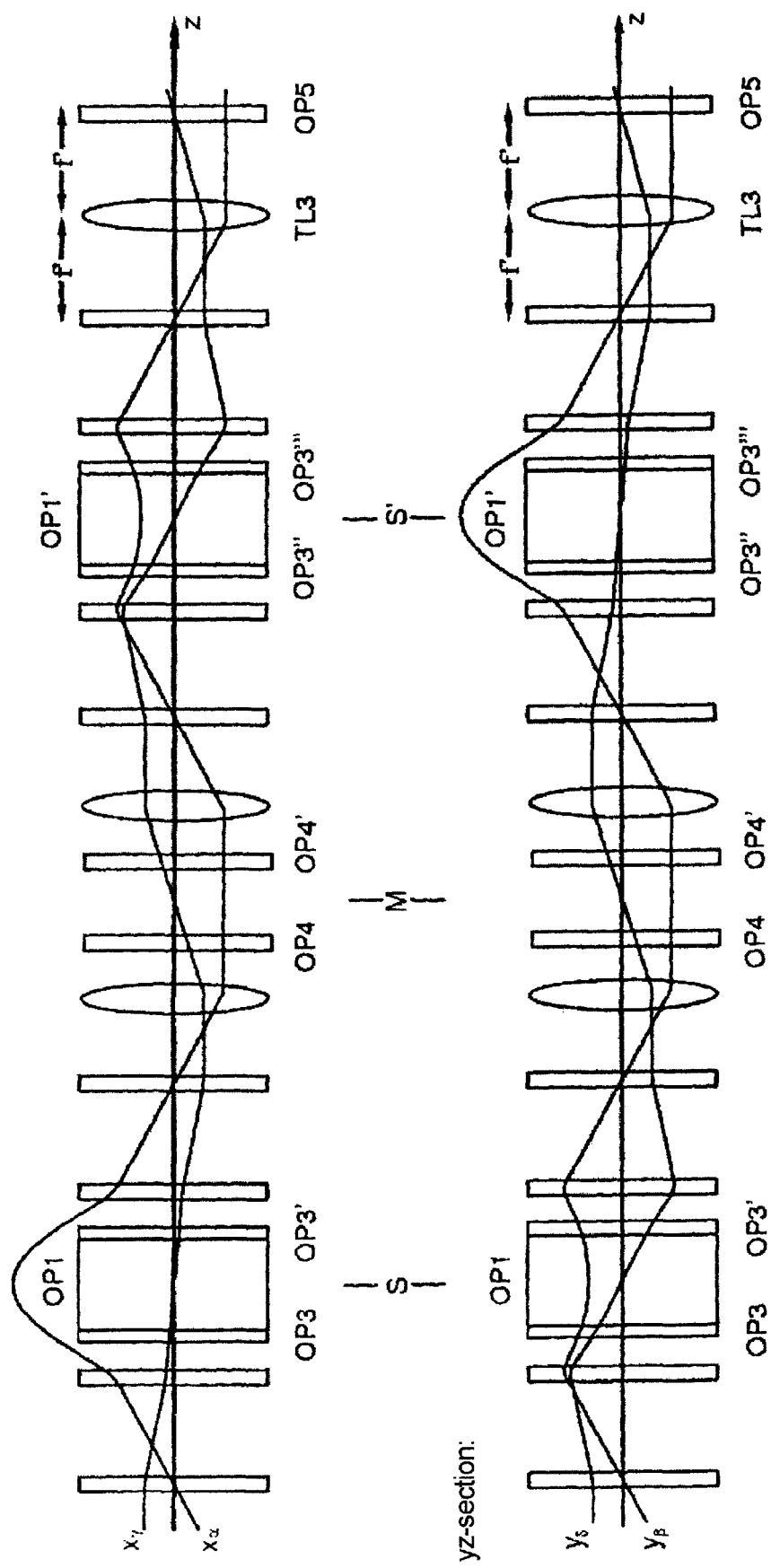
FIG. 3 shows the arrangement of an external octupole field in the system according to FIG. 1.

FIG. 3 shows the arrangement of the octupole fields for the case in which the correction of the four-fold third order astigmatism takes place via an octupole field, OP5, arranged outside the corrective. The construction consequently agrees with that described in FIG. 1, so that reference is made to this in order to avoid repetition. The quadrupoles, QP3, QP3', have in each case an octupole field, OP1, OPT, superimposed on them. An individual additional transfer lens, TL3, with focal length f follows the second correction piece at a distance f from the center, whose last quadrupole, QPT'', and generates an image of the central planes of the correction pieces, S, S' at a distance 2f from the center of QPV'', where the octupole field, OP5, is located. The above-described octupole fields, OP1, OPV, are symmetrically oriented with respect to the plane, M, and, together with OP5, serve for complete correction of the third order axial aberration.

The invention claimed is:

1. A corrective for eliminating a third order aperture aberration and a first order, first-degree axial chromatic aberration, the corrective comprising:
    a first correction piece having an odd number of at least five multipole elements for generating quadrupole fields and at least one octupole field, said first correction piece being symmetrically constructed about a central plane thereof, with a central multipole element for generating a quadrupole field of said first correction piece being centered relative to said central plane of said first correction piece and having combined electric-magnetic quadrupole fields;
    a second correction piece having an odd number of at least five multipole elements for generating quadrupole fields and at least one octupole field, said second correction piece being symmetrically constructed about central plane thereof, with a central multipole element for generating a quadrupole field of said second correction piece being centered relative to said central plane of said second correction piece and having combined electric-magnetic quadrupole fields, said second correction piece being arranged behind said first correction piece in a direction of an optical axis, wherein said quadrupole fields in said second correction piece are oriented antisymmetrically to those in said first correction piece, said quadrupole fields being set such that an intermediate image lies substantially in a first quadrupole field and a last quadrupole field of said first correction piece and of said second correction piece;
    a transfer lens system arranged symmetrically relative to a central plane of said corrective, said transfer lens system including at least one round lens, a setting of said transfer lens system taking place so that said central plane of said first correction piece and said central plane of said second correction piece are imaged anamorphically on one another, wherein a magnification in a first principal section is a reciprocal of a magnification in a second principal section, said central quadrupole field of said first correction piece and said central quadrupole field of said second correction piece being superimposed by an octupole field.

2. The corrective for eliminating a third order aperture aberration and a first order, first-degree axial chromatic aberration according to claim 1, wherein said transfer lens system comprises two round lenses of focal length, f, said two round lenses being arranged at a distance f from adjacent quadrupole fields of said first correction piece and said second correction piece and at a distance 2f from one another.

3. The corrective for eliminating a third order aperture aberration and a first order, first-degree axial chromatic aberration according to claim 1, wherein said transfer lens system includes a multipole element centered relative to said central plane of said corrective and generating an octupole field.

4. The corrective for eliminating a third order aperture aberration and first order, first-degree axial chromatic aberration according to claim 3, wherein said multipole element also generates a dodecapole field.

5. The corrective for eliminating a third order aperture aberration and a first order, first-degree axial chromatic aberration according to claim 1, further comprising a multipole element disposed outside said corrective in a plane optically conjugated relative to said central plane of each of said first correction piece and said second correction piece and generating an octupole field.

6. The corrective for eliminating a third order aperture aberration and first order, first-degree axial chromatic aberration according to claim 5, wherein said multipole element also generates a dodecapole field.

7. The corrective for eliminating a third order aperture aberration and a first order, first-degree axial chromatic aberration according to claim 1, wherein said central quadrupole field and said octupole field of said first and said second correction pieces are generated in said central multipole elements.

8. The corrective for eliminating a third order aperture aberration and a first order, first-degree axial chromatic aberration according to claim 7, wherein said central multipole elements are dodecapole elements and generate additional, superimposed dodecapole fields having an orientation that is antisymmetrical with respect to said central plane of the corrective.

9. The corrective for eliminating a third order aperture aberration and a first order, first-degree axial chromatic aberration according to claim 1, wherein said lens transfer system includes two multipole elements which are equidistantly arranged before, and after, said central plane of said corrective and which generate octupole fields.

10. The corrective for eliminating a third order aperture aberration and a first order, first-degree axial chromatic aberration according to claim 1, further comprising two multipole elements of said first correction piece and two multipole elements of said second correction piece, one arranged before, and one after, said central multipole element for respectively generating said central quadrupole field of said first correction piece and of said second correction piece, wherein said multipole elements generate octupole fields.

11. The corrective for eliminating a third order aperture aberration and first order, first-degree axial chromatic aberration according to claim 10, wherein said multipole elements also generate additional superimposed dodecapole fields which are oriented symmetrically with respect to a center of correction pieces and antisymmetrically with respect to said center of the corrective.

12. An electron microscope, comprising:
   a corrective for eliminating a third order aperture aberration and a first order, first-degree axial chromatic aberration, said corrective including:
      a first correction piece having an odd number of at least five multipole elements for generating quadrupole fields and at least one octupole field, said first correction piece being symmetrically constructed about a central plane thereof, with a central multipole element for generating a quadrupole field of said first correction piece being centered relative to said central plane of said first correction piece and having combined electric-magnetic quadrupole fields;
      a second correction piece having an odd number of at least five multipole elements for generating quadrupole fields and at least one octupole field, said second correction piece being symmetrically constructed about a central plane thereof, with a central multipole element for generating a quadrupole field of said second correction piece being centered relative to said central plane of said second correction piece and having combined electric-magnetic fields, said second correction piece being arranged behind said first correction piece in a direction of an optical axis, wherein said quadrupole fields in said second correction piece are oriented antisymmetrically to those in said first correction piece, said quadrupole fields being set such that an intermediate image lies substantially in a first quadrupole field and a last quadrupole field of said first correction piece and of said second correction piece;
   a first transfer lens system symmetrically arranged relative to said central plane of the corrective, said first transfer lens system including at least one circular lens and a setting of said first transfer lens system taking place such that said central plane of said first correction piece and said central plane of said second correction piece are imaged anamorphically on one another with a magnification in a first principal section being a reciprocal of a magnification in a second principal section, said central quadrupole field of said first correction piece and said central quadrupole field of said second correction piece being superimposed by an octupole field;
   an objective lens having a corrective-side focal plane connected before, or after, the corrective; and
   a second transfer lens system arranged between said corrective and said objective lens for imaging an object plane in magnified form in a region of an incoming image plane of said corrective and making said central plane of said first correction piece and said central plane of said second correction piece of said corrective, and a corrective-side focal plane of said objective lens, into conjugated planes.

13. The electron microscope according to claim 12, further comprising a third transfer lens system and a multipole element for generating an octupole field for said third transfer lens system arranged before, or after, said corrective, said third transfer lens system imaging said central plane of said first correction piece and said central plane of said second correction piece to central planes of said octupole field for said third lens system.

14. The electron microscope according to claim 12, wherein individual said octupole fields are positioned in planes conjugated relative to said corrective-side focal plane of said objective lens.

* * * * *